United States Patent
Long et al.

(10) Patent No.: US 9,583,357 B1
(45) Date of Patent: *Feb. 28, 2017

(54) SYSTEMS AND METHODS FOR REVERSE PULSING

(71) Applicant: Lam Research Corporation, Fremont, CA (US)

(72) Inventors: Maolin Long, Santa Clara, CA (US); Zhongkui Tan, San Jose, CA (US); Ying Wu, Dublin, CA (US); Qian Fu, Pleasanton, CA (US); Alex Paterson, San Jose, CA (US); John Drewery, San Jose, CA (US)

(73) Assignee: Lam Research Corporation, Fremont, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/139,045

(22) Filed: Apr. 26, 2016

Related U.S. Application Data

(63) Continuation of application No. 14/863,331, filed on Sep. 23, 2015.

(60) Provisional application No. 62/201,541, filed on Aug. 5, 2015.

(51) Int. Cl.
  *H01L 21/3065* (2006.01)
  *H01L 21/311* (2006.01)
  *H01L 21/67* (2006.01)

(52) U.S. Cl.
  CPC .... *H01L 21/3065* (2013.01); *H01L 21/67069* (2013.01)

(58) Field of Classification Search
  None
  See application file for complete search history.

(56) References Cited

U.S. PATENT DOCUMENTS

| | | | |
|---|---|---|---|
| 6,372,654 B1* | 4/2002 | Tokashiki | H01J 37/321 257/E21.311 |
| 8,692,467 B2* | 4/2014 | Benjamin | H01J 37/32082 118/723 E |
| 2011/0031216 A1* | 2/2011 | Liao | H01J 37/32082 216/67 |
| 2013/0009545 A1* | 1/2013 | Benjamin | H01J 37/32082 315/111.21 |
| 2013/0105443 A1* | 5/2013 | Banna | H01L 21/31116 216/67 |
| 2013/0168354 A1* | 7/2013 | Kanarik | H01J 37/32082 216/68 |

* cited by examiner

*Primary Examiner* — Shamim Ahmed
(74) *Attorney, Agent, or Firm* — Martine Penilla Group, LLP

(57) ABSTRACT

Systems and methods for reverse pulsing are described. One of the methods includes receiving a digital signal having a first state and a second state. The method further includes generating a transformer coupled plasma (TCP) radio frequency (RF) pulsed signal having a high state when the digital signal is in the first state and having a low state when the digital signal is in the second state. The method includes providing the TCP RF pulsed signal to one or more coils of a plasma chamber, generating a bias RF pulsed signal having a low state when the digital signal is in the first state and having a high state when the digital signal is in the second state, and providing the bias RF pulsed signal to a chuck of the plasma chamber.

18 Claims, 9 Drawing Sheets

SYSTEMS AND METHODS FOR REVERSE PULSING

CLAIM OF PRIORITY

This application is a continuation of and claims the benefit of and priority, under 35 U.S.C. §120, to U.S. patent application Ser. No. 14/863,331, filed on Sep. 23, 2015, and titled "Systems And Methods For Reverse Pulsing", which claims the benefit of and priority, under 35 U.S.C. §119(e), to U.S. Provisional Patent Application No. 62/201,541, filed on Aug. 5, 2015, and titled "Systems and Methods for Reverse Pulsing", both of which are hereby incorporated by reference in their entirety.

FIELD

The present embodiments relate to systems and methods for reverse pulsing of radio frequency signals.

BACKGROUND

Plasma systems are used to perform a variety of operations on wafers. A radio frequency (RF) signal is provided to a plasma chamber in which a wafer is located. Also, one or more gases are supplied to the plasma chamber and upon reception of the RF signal, plasma is generated within the plasma chamber. One of the operations is to etch the wafer using the plasma.

It is in this context that embodiments described in the present disclosure arise.

SUMMARY

Embodiments of the disclosure provide apparatus, methods and computer programs for reverse synchronization between bias and source radio frequency (RF) signals. It should be appreciated that the present embodiments can be implemented in numerous ways, e.g., a process, or an apparatus, or a system, or a piece of hardware, or a method, or a computer-readable medium. Several embodiments are described below.

A source RF signal that is provided to transformer coupled plasma (TCP) RF coils and a bias RF signal that is provided to a chuck are both pulsed and their pulsing sequences are reversely synchronized to reduce effects of micro-loading/ARDE (Aspect ratio dependent etching), improve selectivity and/or satisfy other potential process benefits in RF plasma based semiconductor fabrication. For example, when the bias RF signal is in the state S0 (with power OFF or lower power), the source RF pulse signal is in a state S1 and when the bias RF signal is in the state S1 (with power ON or higher power), the source RF pulse signal is in a state S0. Reverse multi-level pulsing also provides a number of process tuning knobs that can benefit selectivity, etch rate, uniformity profile adjustment between etch and deposition, etc.

In one embodiment, a method for reverse pulsing is described and is used to perform conductor etch. Conductor etch is performed using a chamber having a TCP coil over a top window cover of the chamber. In operation, one method includes receiving a digital signal having a first state and a second state. The method further includes generating a TCP RF pulsed signal having a high state when the digital signal is in the first state and having a low state when the digital signal is in the second state. The method includes providing the TCP RF pulsed signal to one or more coils of a plasma chamber, generating a bias RF pulsed signal having a low state when the digital signal is in the first state and having a high state when the digital signal is in the second state, and providing the bias RF pulsed signal to a chuck of the plasma chamber.

In an embodiment, a system for reverse pulsing is described. The system includes one or more bias RF generators (with different frequencies) for generating one or more bias RF pulsed signals. The system further includes a bias match coupled to the one or more bias RF generators for generating a modified bias RF signal from the one or more bias RF pulsed signals. The system includes a plasma chamber. The plasma chamber includes a chuck coupled to the bias match mainly for controlling the ion energy towards the wafer upon receiving the modified bias RF signal. The system further includes one or more source RF generators for generating one or more source RF pulsed signals and a source match coupled to the one or more source RF generators for generating a modified plasma upon receiving the one or more source RF pulsed signals. A first one of the source RF pulsed signals is in a high state, e.g., high power level, etc., when a first one of the bias RF pulsed signals is in a low state, e.g., low power level, zero power level, etc., and the first source pulsed RF signal is in a low state when the first bias RF pulsed signal is in a high state.

To reduce effects of micro-loading, improve selectivity, and/or satisfy other potential process requirements, reverse pulsing between TCP and bias is described. The reverse pulsing with various multi-level combinations takes advantages of dynamics in plasma property modulation during different pulsing periods of ON, OFF, high power, low power, and combinations between TCP RF power and bias RF power.

Due to different time scales between electron temperature decay and ion density decrease during an OFF period in pulsed plasma, reverse pulsing is used to etch during bias RF power ON period, which is the same as TCP power OFF period, with a low electron temperature while ion density still remains relatively high. This reduces negative effects of micro-loading and potentially offers other process benefits, e.g., an increased etch rate, improved selectivity, higher aspect ratios, etc.

In some embodiments, the reverse multi-level pulsing also provides a number of process tuning knobs that benefit selectivity, etch rate, uniformity profile adjustment between etch and deposition, etc.

Other aspects will become apparent from the following detailed description, taken in conjunction with the accompanying drawings.

BRIEF DESCRIPTION OF THE DRAWINGS

The embodiments are understood by reference to the following description taken in conjunction with the accompanying drawings.

DETAILED DESCRIPTION

The following embodiments describe systems and methods for reverse pulsing. It will be apparent that the present embodiments may be practiced without some or all of these specific details. In other instances, well known process operations have not been described in detail in order not to unnecessarily obscure the present embodiments.

Figure 4A:
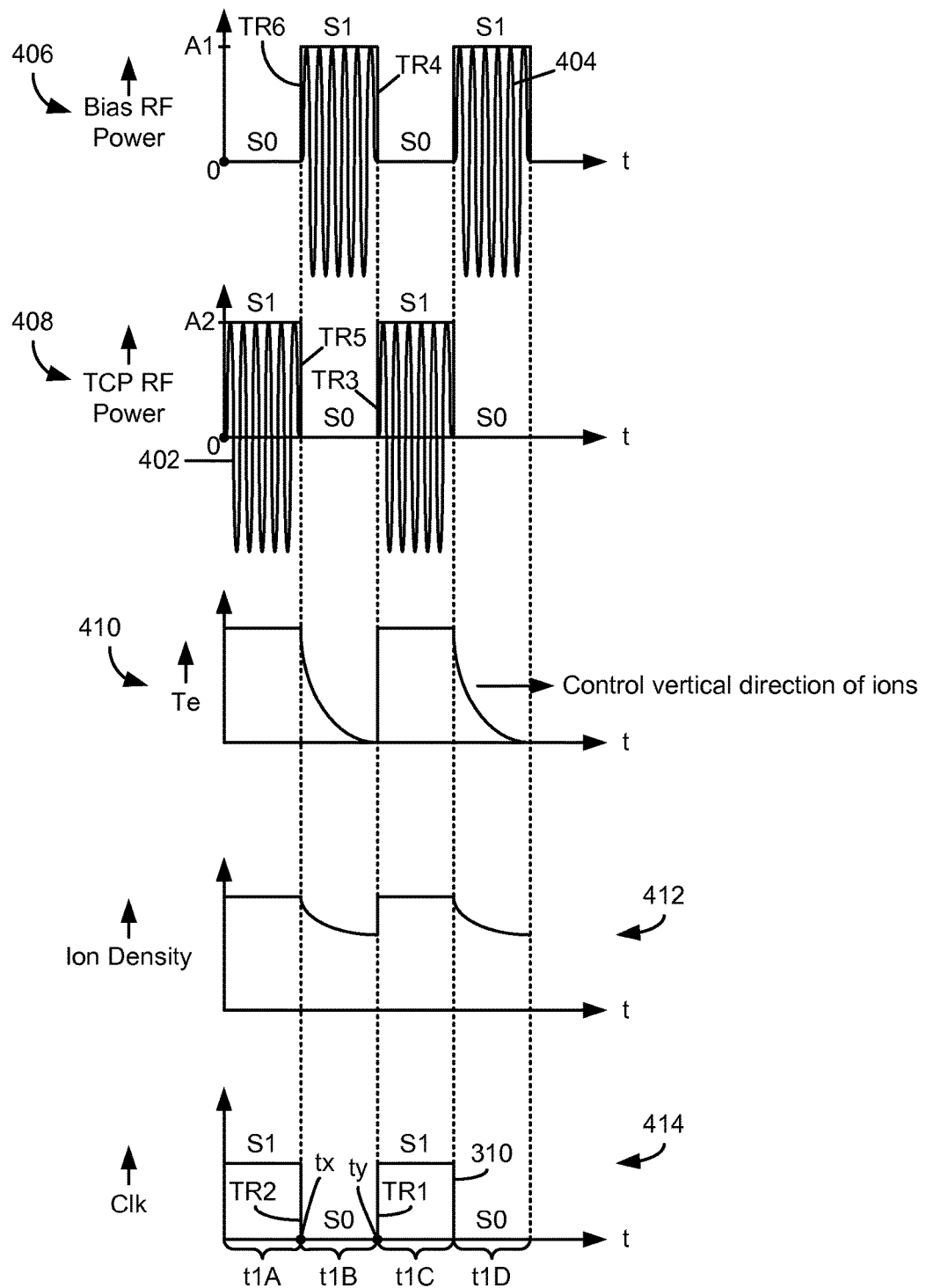
FIG. 4A shows graphs to illustrate opposite states of a transformer coupled plasma (TCP) RF pulsed signal and a bias RF pulsed signal.

Reverse pulsing between transformer coupled plasma (TCP) and bias for plasma processing is proposed with various multi-level combinations, as described below with reference to FIGS. 4A, 4B, 4C, and 4D, to take advantages of dynamics in plasma property modulation during different pulsing periods of ON, OFF, high power, low power, and their combinations between TCP RF power and bias RF power. Although FIG. 4A shows a case of ON/OFF reverse pulsing, multi-level reverse pulsing offers even more process tuning knobs. The reverse pulsing reduces effects of micro-loading/ARDE (Aspect ratio dependent etching), improves selectivity, and facilitates achievement of other potential process requirements.

Figure 1:
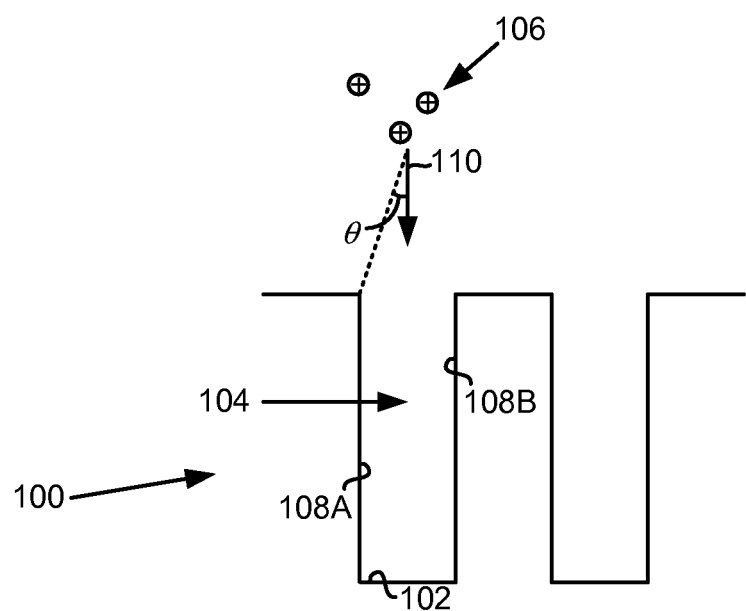
FIG. 1 is a diagram to illustrate that a lateral direction of travel of ions creates micro-loading, in accordance with an embodiment described in the present disclosure.

FIG. 1 is a diagram to illustrate that a direction of ions 106 creates micro-loading. When plasma is created in a plasma chamber for etching a substrate stack 100, e.g., a wafer, a semiconductor substrate with an oxide layer on top of the substrate, a semiconductor substrate with a monomer or a polymer on top of the substrate, a semiconductor substrate, etc., the ions 106 of the plasma are to be directed towards a bottom 102 of a feature 104 formed within the substrate stack 100. When the ions are directed towards side walls 108A and 108B of the feature 104, e.g., with an angle θ with respect to a vertical direction 110, micro-loading occurs and etch rate at the bottom of the feature is reduced. By applying reverse pulsing, as described herein, probability that the ions will travel in a vertical direction to the bottom of the trenches is increased to further decrease effects of ARDE or micro-loading.

Figure 2:
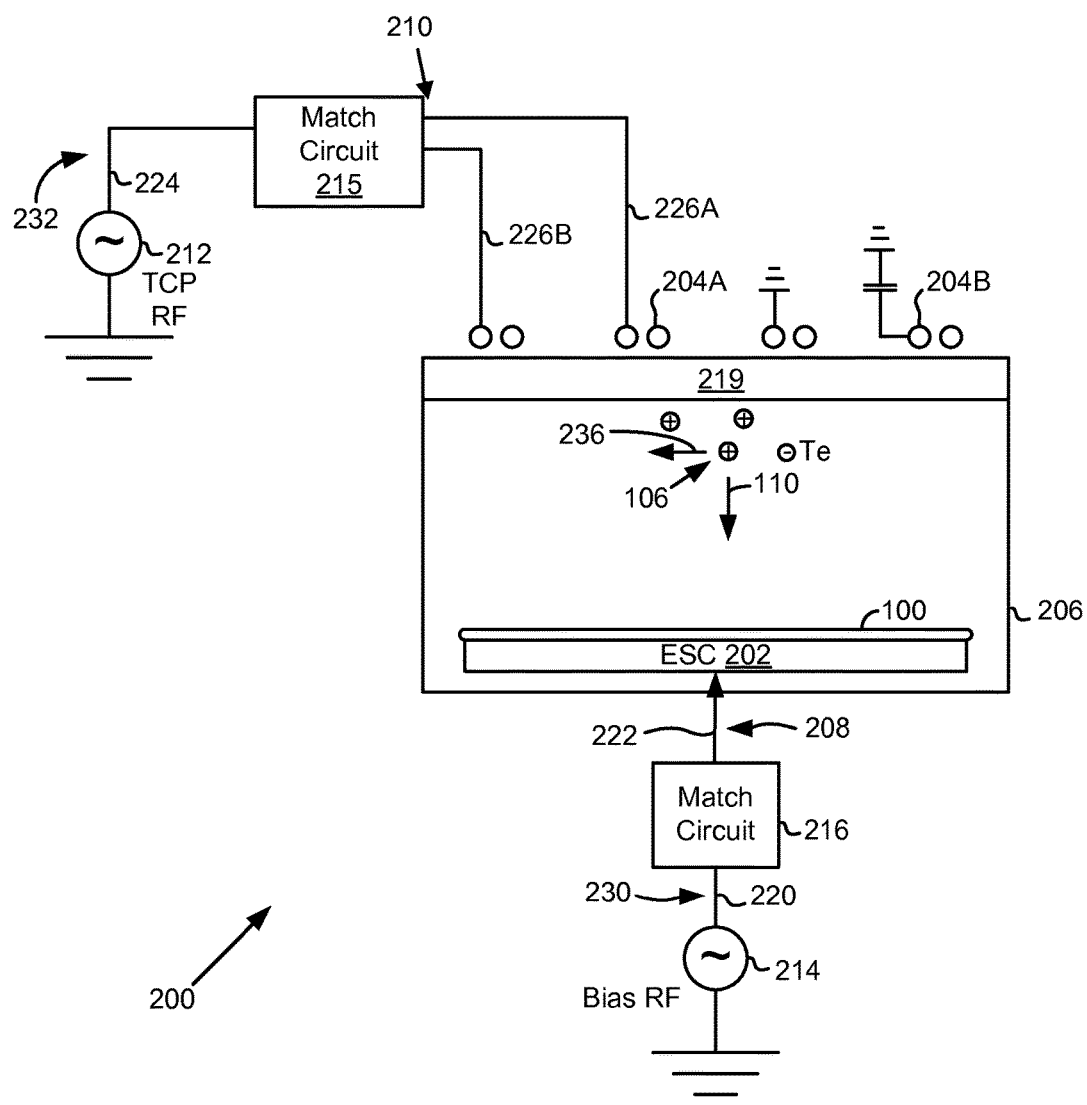
FIG. 2 is a diagram of an embodiment of a system that reduces chances of micro-loading.

FIG. 2 is a diagram of an embodiment of a system 200 that reduces chances of micro-loading. The system 200 includes a TCP RF power supply 212, a match circuit 215, a plurality of TCP RF coils 204A and 204B, a plasma chamber 206, a bias RF power supply 214, and a match circuit 216. A dielectric window 219 separates the TCP RF coils 204A and 204B from an inside of the plasma chamber 206. Examples of materials used to fabricate the dielectric window 216 include quartz, or ceramic, etc.

The plasma chamber 206 includes an electrostatic chuck (ESC) 202 on which the substrate stack 100 is placed for processing, e.g., etching, or deposition, or sputtering, or cleaning, etc.

The bias RF power supply 214 is coupled to the match circuit 216 via an RF cable 220. The bias RF power supply 214 generates and supplies a bias pulsed RF signal 230 to the match circuit 216 via the RF cable 220. The match circuit 216 receives the bias pulsed RF signal 230 and matches an impedance of a load, e.g., plasma formed within the plasma chamber 206.

The TCP RF power supply 212 of a TCP RF generator is connected to the match circuit 215 via an RF cable 224. The TCP RF power supply 212 generates a source pulsed RF signal 232 and supplies the source pulsed RF signal to the match circuit 215. The match circuit 215 receives the source pulsed RF signal 232 and matches an impedance of a load, e.g., the TCP RF coils 204A and 204B and RF cables 226A and 226B, etc.

The source RF pulsed signal 232 is pulsed in an opposite direction to that of pulsing of the bias RF pulsed signal 230. For example, when a state of the source RF pulsed signal 232 is high, a state of the bias RF pulsed signal 230 is low and when a state of the source RF pulsed signal 232 is low, a state of the bias RF pulsed signal 230 is high. An example of a high state is a state at a high power level, and an example of a low state is a state at a low power level. The zero level of the source RF pulsed signal 232 during the state S0 of the RF pulsed signal 232 facilitates reducing temperature Te of electrons during the OFF period. The reduction in the temperature and the potential improves a thermal velocity of the ions 106. For example, the reduction in the temperature and the potential increases chances of the ions 106 to be directed in the vertical direction 110 instead of a lateral direction 236 or to be directed closer to the vertical direction 110 than to the lateral direction 236 to mitigate micro-loading.

In one embodiment, instead of one bias RF generator, multiple bias RF generators are coupled to the match circuit 216. Each bias RF generator has a different frequency. For example, one of the bias RF generators has a frequency of operation of 13.56 megahertz (MHz), another one of the bias RF generators has a frequency of operation of 1 MHz, and yet another one of the bias RF generators has a frequency of operation of 60 MHz. Each of the bias RF generators is coupled to the match circuit 216 via a separate RF cable.

In an embodiment, instead of the TCP RF generator, multiple TCP RF generators are coupled to the match circuit 215. Each TCP RF generator has a different frequency. Each of the TCP RF generators is coupled to the match circuit 215 via a separate RF cable. In one embodiment, the TCP RF coils 204A and 204B are co-planar. In an embodiment, the TCP RF coil 204A lies in a different plane than a plane in which the TCP RF coil 204B is located. In one embodiment, instead of the two TCP RF coils 204A and 204B, any other number of coils, e.g., one, three, etc., are placed on top of the plasma chamber 206.

Figure 3:
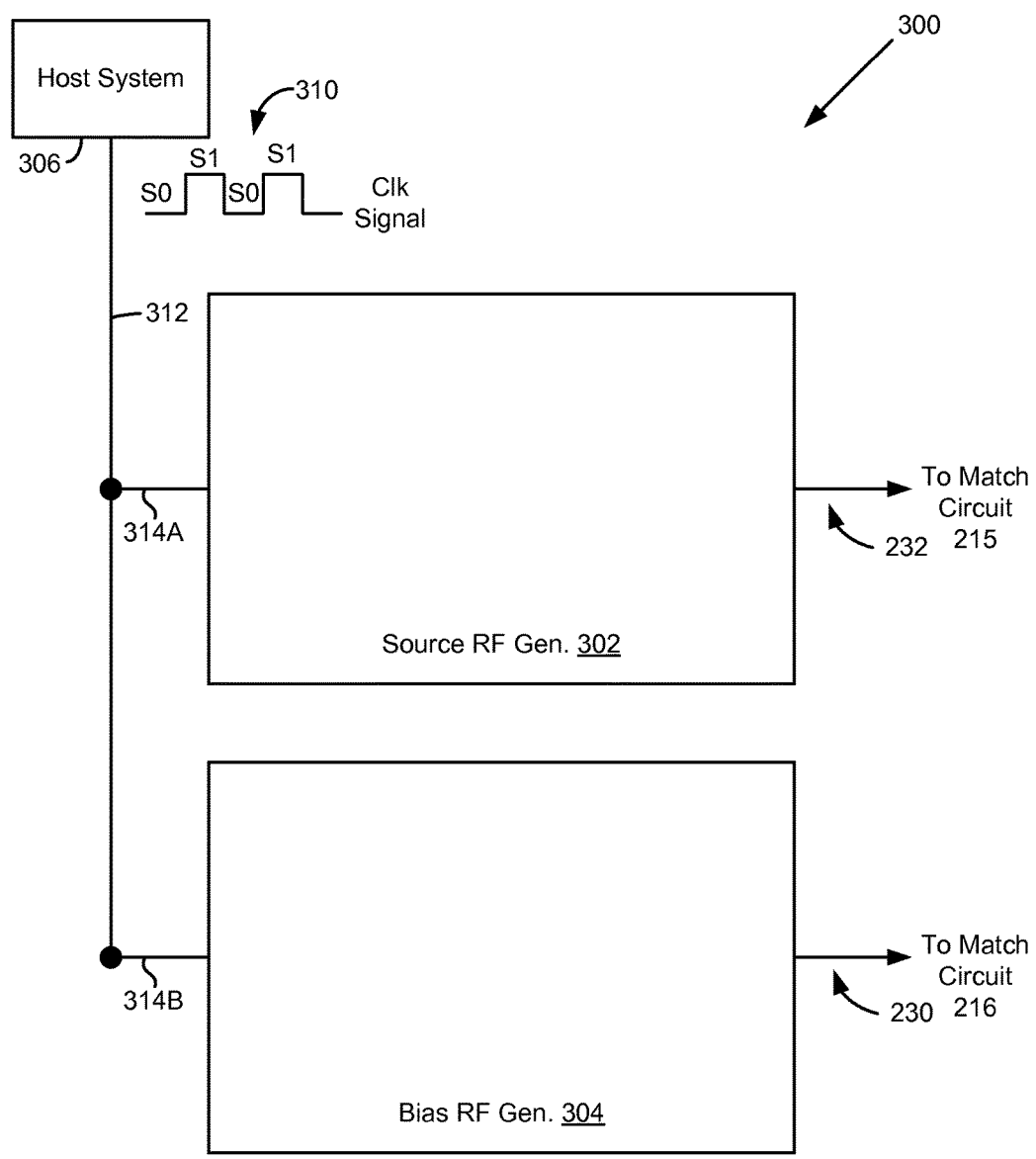
FIG. 3 is a diagram of an embodiment of a system to illustrate synchronization of reverse pulsing in a source radio frequency (RF) pulsed signal and a bias RF pulsed signal.

FIG. 3 is a diagram of an embodiment of a system 300 to illustrate synchronization of reverse pulsing in the source RF pulsed signal 232 and the bias RF pulsed signal 230. The system 300 includes a host system 306, e.g., a computer, a laptop computer, a tablet, a cell phone, etc. The host system 306 is coupled to the source RF generator 302 that includes the TCP RF power supply 212 (FIG. 2). Moreover, the host system 306 is coupled to the bias RF generator 304 that includes the bias RF power supply 214 (FIG. 2). The host system 306 generates a digital pulsed signal 310, e.g., a clock (Clk) signal, etc. For example, a processor of the host system 306 generates the digital pulsed signal 310. As another example, a clock oscillator within the host system 306 generates the digital pulsed signal 310. As yet another example, a clock oscillator coupled to a phase locked loop generates the digital pulsed signal 310. As another example, a command or command set is sent from the host system 306 to the source RF generator 302 and the bias RF generator 304 informing the generators how to pulse.

The digital pulsed signal 310 has a state S1, e.g., a high state, a state 1, a bit 1, etc., and a state S0, e.g., a low state, a state 0, a bit 0, etc. The digital pulsed signal periodically pulses between the states S1 and S0. For example, the digital pulsed signal is in the state S0 for a period of time, then transitions from the state S0 to a state S1, stays in the state S1 for the period of time, and then transitions from the state S1 to the state S0.

The source RF generator 302 receives the digital pulsed signal 310 via a cable 312 and another cable 314A and the bias RF generator 304 receives the digital pulsed signal 310 via a cable 312 and a cable 314B. The source RF power supply 212 (FIG. 2) of the source RF generator 302 generates the source RF pulsed signal 232 synchronous to the digital pulsed signal 310 and the bias RF power supply 214 (FIG. 2) of the bias RF generator 304 generates the bias RF pulsed signal 230 synchronous to the digital pulsed signal 310. For example, a processor of the source RF generator 302 receives the digital pulsed signal 310 at a time, determines a state of the digital pulsed signal 310 at that time, and sends a control signal to the source RF power supply 212 to generate the source RF pulsed signal 232 having a state of the digital pulsed signal 310. As another example, a processor of the bias RF generator 304 receives the digital pulsed signal 310 at a time, determines a state of the digital pulsed signal 310 at that time, and sends a control signal to the bias RF power supply 214 to generate the bias RF pulsed signal 230 having the a state opposite to that of the digital pulsed signal 310.

In this example, a processor of the source RF generator 302 receives the digital pulsed signal 310 at a time, determines that a state of the digital pulsed signal 310 transitions from a low state to a high state at that time, and sends a control signal to the source RF power supply 212 to transition the source RF pulsed signal 232 from a low state to a high state at the time. In this example, a processor of the bias RF generator 304 receives the digital pulsed signal 310 at a time, determines that a state of the digital pulsed signal 310 transitions from a low state to a high state at that time, and sends a control signal to the bias RF power supply 214 to transition the bias RF pulsed signal 230 from a high state to a low state at that time. In this example, the processor of the source RF generator 302 receives the digital pulsed signal 310 at a time, determines that a state of the digital pulsed signal 310 transitions from a high state to a low state at that time, and sends a control signal to the source RF power supply 212 to transition the source RF pulsed signal 232 from a high state to a low state at the time. In this example, a processor of the bias RF generator 304 receives the digital pulsed signal 310 at a time, determines that a state of the digital pulsed signal 310 transitions from a high state to a low state at that time, and sends a control signal to the bias RF power supply 214 to transition the bias RF pulsed signal 230 from a low state to a high state at that time.

In one embodiment, the digital pulsed signal 310 is generated by the bias RF generator 304 instead of by the host system 306. For example, the bias RF generator 304 includes a clock source, e.g., a clock oscillator, a clock oscillator coupled to a phase locked loop, etc., located within the bias RF generator 304. As another example, the bias RF generator 304 includes a processor that generates the digital pulsed signal 310. The digital pulsed signal 310 is supplied from the bias RF generator 304 to the source RF generator 302 to synchronize generation of the source RF pulsed signal 232 and the bias RF pulsed signal 230 as described herein.

FIG. 4A shows graphs 406, 408, 410, 412, and 414 to illustrate opposite states of a TCP RF pulsed signal 402 and a bias RF pulsed signal 404. The TCP RF pulsed signal 402 is an example of the source RF pulsed signal 232 (FIG. 2) and the bias RF pulsed signal 404 is an example of the bias RF pulsed signal 230 (FIG. 2).

The graph 406 plots voltage waveform of the bias RF pulsed signal 404 versus time t. Moreover, the graph 408 plots voltage waveform of the TCP RF pulsed signal 402 versus the time t and the graph 410 plots the electron temperature Te versus time. The graph 412 plots ion density of the ions 106 (FIG. 1) versus the time t and the graph 414 plots the digital pulsed signal 310 versus the time t.

The source RF generator 302 generates a high state S1, e.g., power ON or higher power, etc., of the TCP RF pulsed signal 402 when the digital pulsed signal 310 is in the state S1 and generates a low state S0, e.g., zero power, or lower power, etc., of the TCP RF pulsed signal 402 when the digital pulsed signal 310 is in the state S0. For example, during a time period t1A in which the digital pulsed signal 310 is in the state S1, the high state S1 of the TCP RF pulsed signal 402 is generated and during a time period t1B in which the digital pulsed signal 310 is in the state S0, the low state S0 of the TCP RF pulsed signal 402 is generated. Also, during a time period t1C in which the digital pulsed signal 310 is in the state S1, the high state S1 of the TCP RF pulsed signal 402 is generated and during a time period t1D in which the digital pulsed signal 310 is in the state S0, the low state S0 of the TCP RF pulsed signal 402 is generated. Each time period t1A, t1B, t1C, and t1D is the same.

Also, the TCP RF pulsed signal 402 transitions from the low state S0 to the high state S1 within a predetermined amount of time, e.g., within a portion of the time period t1B or a portion of the time period t1C, or phase lag time, or phase lead time, etc., from a time ty of a transition TR1 of the digital pulsed signal 310 from the state S0 to the state S1. In one embodiment, the TCP RF pulsed signal 402 transitions from the low state S0 to the high state S1 at the time ty of the transition TR1 of the digital pulsed signal 310 from state S0 to the state S1.

Furthermore, the TCP RF pulsed signal 402 transitions from the high state S1 to the low state S0 within a predetermined amount of time, e.g., within a portion of the time period t1A or a portion of the time period t1B, or phase lag time, or phase lead time, etc., from a time tx of a transition TR2 of the digital pulsed signal 310 from the state S1 to the state S0. In an embodiment, the TCP RF pulsed signal 402 transitions from the high state S1 to the low state S0 at the time tx of the transition TR2 of the digital pulsed signal 310 from the state S1 to the state S0.

Moreover, the bias RF generator 304 generates a low state S0, e.g., zero power, or lower power, etc., of the bias RF pulsed signal 404 when the digital pulsed signal 310 is in the state S1 and generates a high state S1, e.g., power ON or higher power, etc., of the bias RF pulsed signal 404 when the digital pulsed signal 310 is in the state S0. For example, during the time period t1A in which the digital pulsed signal 310 is in the state S1, the low state S0 of the bias RF pulsed signal 404 is generated and during the time period t1B in which the digital pulsed signal 310 is in the state S0, the high state S1 of the bias RF pulsed signal 404 is generated.

Furthermore, the bias RF pulsed signal 404 transitions from the high state S1 to the low state S0 within a predetermined amount of time, e.g., within a portion of the time period t1B or a portion of the time period t1C, or phase lag time, or phase lead time, etc., from the time ty of the transition TR1 of the digital pulsed signal 310 from the state S0 to the state S1. In one embodiment, the bias RF pulsed signal 404 transitions from the high state S1 to the low state S0 at the time ty of the transition TR1 of the digital pulsed signal 310 from the state S0 to the state S1.

Moreover, the bias RF pulsed signal 404 transitions from the low state S0 to the high state S1 within a predetermined amount of time, e.g., a portion of the time period t1A or a portion of the time period t1B, or phase lag time, or phase lead time, etc., from the time tx of the transition TR2 of the digital pulsed signal 310 from the state S1 to the state S0. In one embodiment, the bias RF pulsed signal 404 transitions from the low state S0 to the high state S1 at the time tx of the transition TR2 of the digital pulsed signal 310 from the state S1 to the state S0.

It should be noted that the TCP RF pulsed signal 402 is reversely synchronized with the bias RF pulsed signal 404. For example, when the state of the bias RF pulsed signal 404 is S0, the state of the TCP RF pulsed signal 402 is S1 and when the state of the bias RF pulsed signal 404 is S1, the state of the TCP RF pulsed signal 402 is S0. As another example, when the bias RF pulsed signal 404 transitions from the state S1 to the state S0, the TCP RF pulsed signal 402 transitions from the state S0 to the state S1 and when the bias RF pulsed signal 404 transitions from the state S0 to the state S1, the TCP RF pulsed signal 402 transitions from the state S1 to the state S0.

The TCP RF pulsed signal 402 has zero power during the low state S0 and a positive amount, e.g., A2, etc., of power during the high state S1. The bias RF pulsed signal 404 has zero power during the low state S0 and a positive amount, e.g., A1, etc., of power during the high state S1.

In one embodiment, the amount A1 is the same as the amount A2. In an embodiment, the amount A1 is different from the amount A2. In an embodiment, the bias RF pulsed signal 404 has a power other than zero during the state S0. Moreover, in one embodiment, the TCP RF pulsed signal 402 has a power other than zero during the state S0. In one embodiment, instead of having the two states S1 and S0, the bias RF pulsed signal 404 is continuous, e.g., has the state S1 at all times, etc. There is no switching between the two states S1 and S0 by the bias RF pulsed signal 404.

It should be noted that the temperature Te of the electrons decreases when the TCP RF pulsed signal 402 is in the state S0 and the bias RF pulsed signal 404 is in the state S1. The decrease in the temperature reduces plasma voltage and reduces micro-loading during etching of the substrate stack 100 (FIG. 1).

Figure 4B:
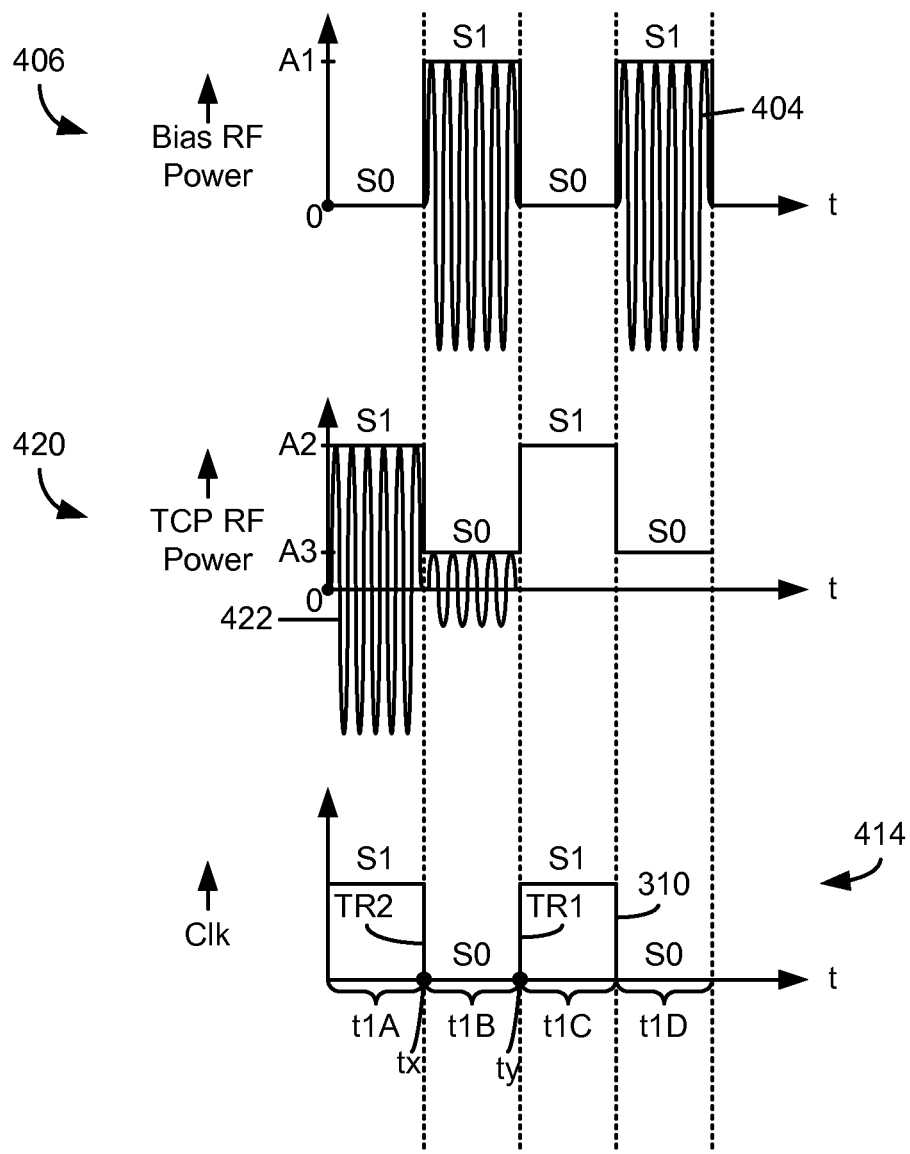
FIG. 4B shows graphs to illustrate that power of a source RF pulsed signal during a state S0 is greater than zero.

FIG. 4B shows graphs 406, 420, and 414. The graph 420 plots power, e.g. peak-to-peak power, etc., of a TCP RF pulsed signal 422 versus the time t. The TCP RF pulsed signal 422 is an example of the TCP RF pulsed signal 232 (FIG. 2). The TCP RF pulsed signal 422 has the high level A2 of power during the high state S1 and a low level A3 of power during the low state S0. The low level A3 is greater than zero power and is lower than the high level A2. It should be noted as shown in the graphs 406 and 420 that the bias RF signal 404 is generated by the bias RF generator 304 (FIG. 3) simultaneous with generation of the TCP RF signal 422 by the source RF generator 302 (FIG. 3).

Figure 4C:
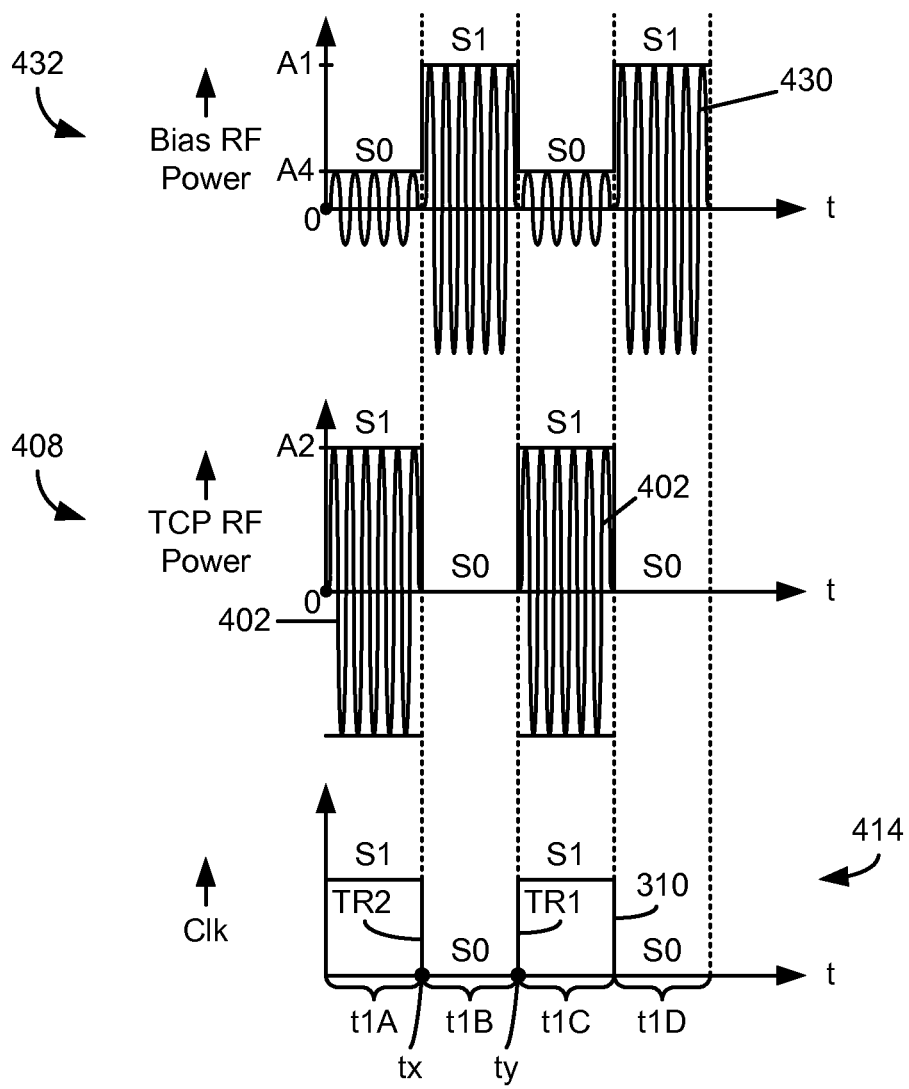
FIG. 4C shows graphs to illustrate that power of a bias RF pulsed signal during a state S0 is greater than zero.

FIG. 4C shows graphs 432, 408, and 414. The graph 432 plots power, e.g. peak-to-peak power, etc., of a bias RF pulsed signal 430 versus the time t. The bias RF pulsed signal 430 is an example of the bias RF pulsed signal 230 (FIG. 2). The bias RF pulsed signal 430 has the high level A1 of power during the high state S1 and a low level A4 of power during the low state S0. The high level A1 is greater than the low level A4 and the low level A4 is greater than the zero power level. It should be noted that as shown in the graphs 408 and 432 that the bias RF signal 430 is generated by the bias RF generator 304 (FIG. 3) simultaneous with generation of the TCP RF signal 402 by the source RF generator 302 (FIG. 3).

In one embodiment, instead of having the two states S1 and S0, the bias RF pulsed signal 430 is continuous, e.g., has the state S1 or the state S0 at all times, etc. There is no switching between the two states S1 and S0 by the bias RF pulsed signal 430 but the bias RF pulsed signal 430 has the state S1 at all times.

Figure 4D:
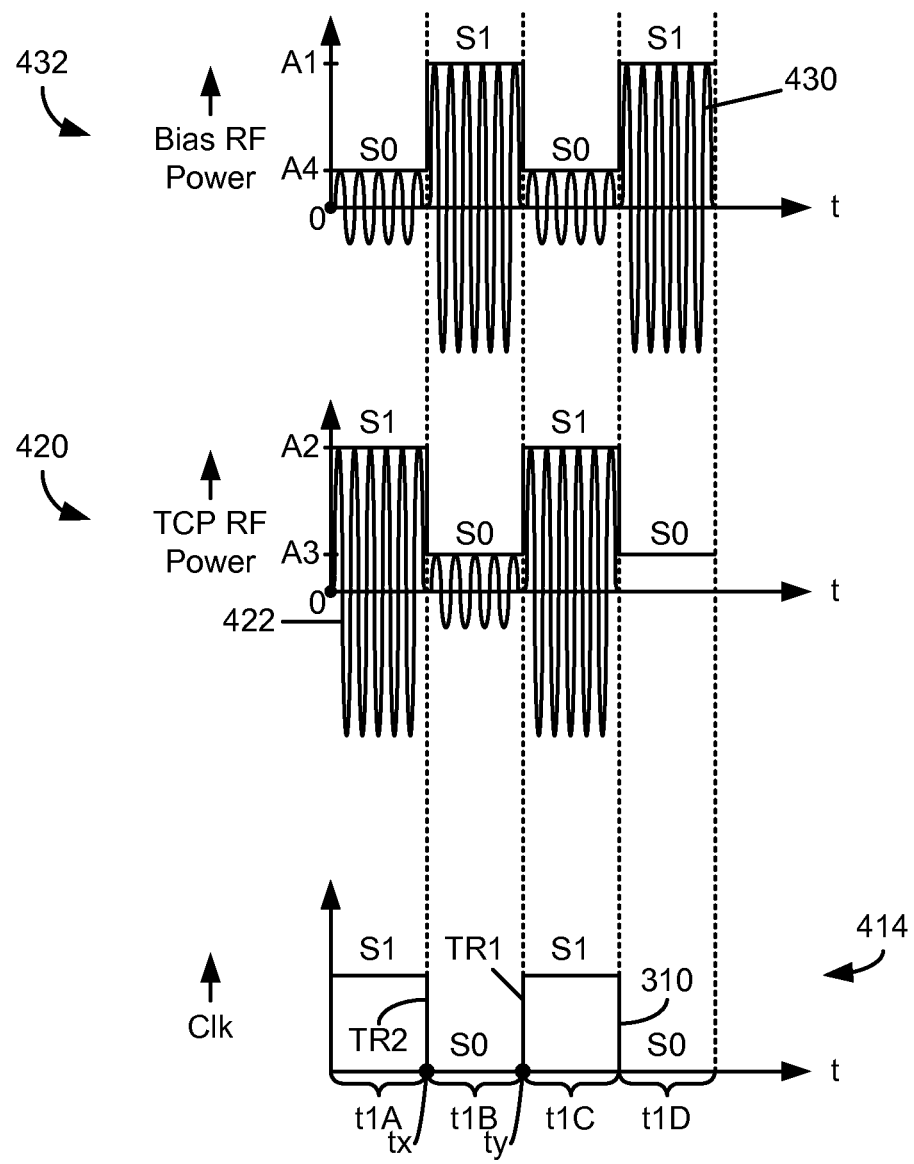
FIG. 4D shows graphs to illustrate that power of a bias RF pulsed signal during a state S0 and power of a source RF pulsed signal during a state S0 are both greater than zero.

FIG. 4D shows the graphs 432, 420, and 414. It should be noted that as shown in the graphs 420 and 432, the bias RF signal 430 is generated by the bias RF generator 304 (FIG. 3) simultaneous with generation of the TCP RF signal 422 by the source RF generator 302 (FIG. 3).

Figure 5A:
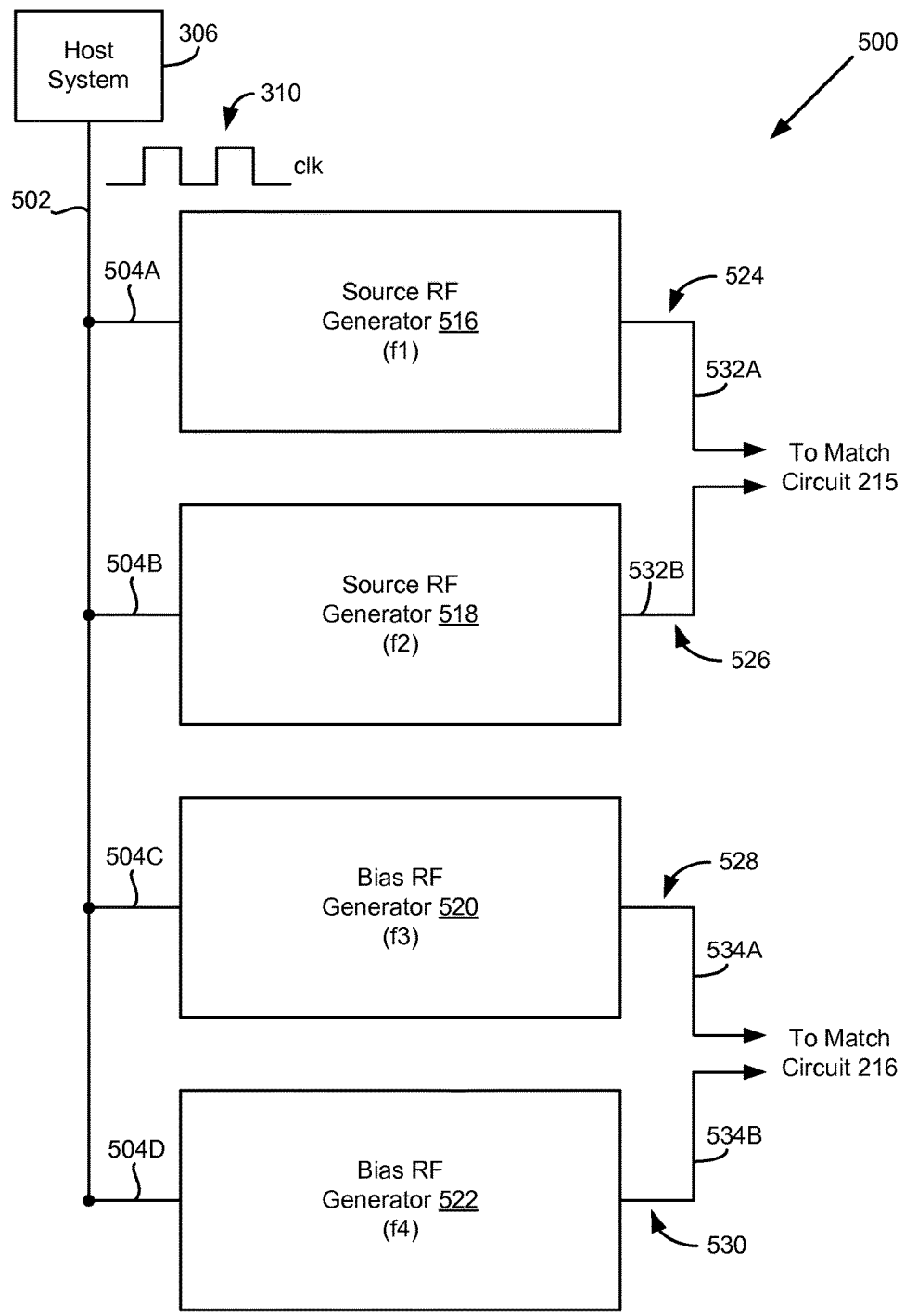
FIG. 5A is a diagram of an embodiment of a system for illustrating use of multiple source RF generators instead of a single source RF generator and multiple bias RF generators instead of a single bias RF generator.

FIG. 5A is a diagram of an embodiment of a system 500 for illustrating use of multiple source RF generators 516 and 518 and multiple bias RF generators 520 and 522. The host system 306 supplies the digital pulsed signal 310 to the source RF generator 516 via a cable 502 and a cable 504A, to the source RF generator 518 via the cable 502 and a cable 504B, to the bias RF generator 520 via the cable 502 and a cable 504C, and to the bias RF generator 522 via the cable 502 and a cable 504D.

The source RF generator 516 generates a source RF pulsed signal 524 having a frequency f1 and the source RF pulsed signal 524 is synchronized to the digital pulsed signal 310. Moreover, the source RF generator 518 generates a source RF pulsed signal 526 having a frequency f2 and the source RF pulsed signal 526 is synchronized to the digital pulsed signal 310. The frequency f2 is different from the frequency f1. For example, the frequency f2 is within a different range of frequencies than a range of frequencies having the frequency f1. The source RF generators 516 and 518 are coupled via corresponding RF cables 532A and 532B to the match circuit 215 and the bias RF generators 520 and 522 are coupled via corresponding RF cables 534A and 534B to the match circuit 216.

The match circuit 215 matches an impedance of the load coupled to the match circuit 215 with that of a source, e.g., the source RF generators 516 and 518, and the RF cables 532A and 532B, etc., coupled to the match circuit 215 to generate a modified source RF pulsed signal. The modified source RF pulsed signal is sent from the match circuit 215 to the TCP RF coils 204A and 204B (FIG. 2) to modify, e.g., improve, etc., a thermal velocity of the ions 106 (FIG. 1) to further improve the etch rate. As an example, the thermal velocity of the ions 106 is modified when the ions 106 are controlled to travel in or closer to the vertical direction 110 (FIG. 1) than in the lateral direction 236 (FIG. 2).

Also, the bias RF generator 520 generates a bias RF pulsed signal 528 having a frequency f3 and the bias RF pulsed signal 528 is synchronized to the digital pulsed signal 310. Moreover, the bias RF generator 522 generates a bias RF pulsed signal 530 having a frequency f4 and the bias RF pulsed signal 530 is synchronized to the digital pulsed signal 310. The frequency f4 is different from the frequency f3. For example, the frequency f4 is within a different range of frequencies than a range of frequencies having the frequency f3.

Moreover, the match circuit 216 matches an impedance of the load coupled to the match circuit 216 with that of a source, e.g., the bias RF generators 520 and 522, and the RF cables 534A and 534B, etc., to generate a modified bias RF pulsed signal. The modified bias RF pulsed signal is sent from the match circuit 216 to the ESC 202 (FIG. 2) to generate or maintain plasma within the plasma chamber 206 (FIG. 2).

Figure 5B:
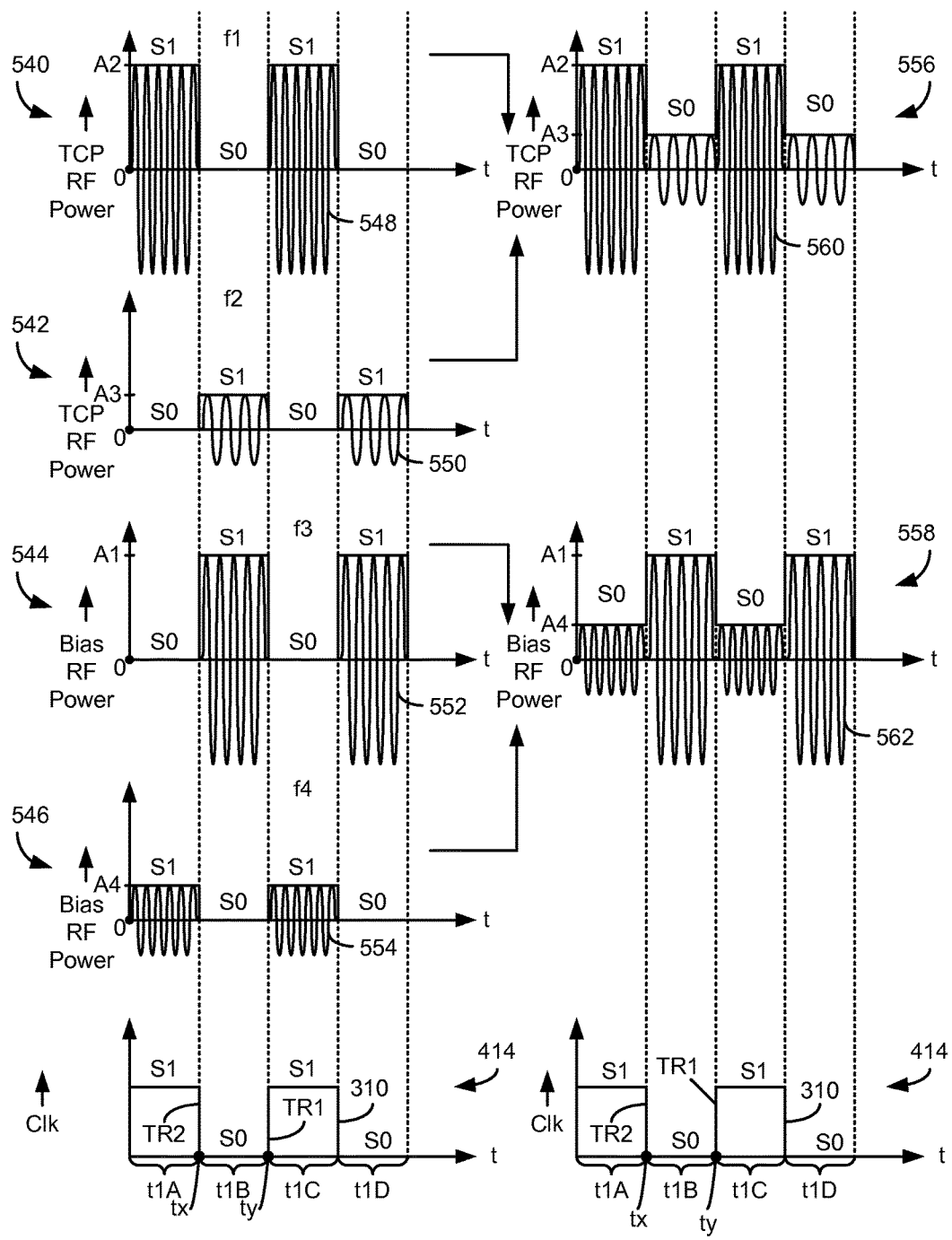
FIG. 5B shows graphs to illustrate that multiple source RF pulsed signals are combined to generate a source RF pulsed signal and multiple bias RF pulsed signals are combined to generate a bias RF pulsed signal.

FIG. 5B shows graphs 540, 542, 544, 546, 556, 558, and 414 to illustrate that multiple source RF pulsed signals 548 and 550 are combined to generate a source RF pulsed signal 560 and multiple bias RF pulsed signals 552 and 554 are combined to generate a bias RF pulsed signal 562. The graph 540 plots power, e.g. peak-to-peak power, etc., of the source RF pulsed signal 548 versus the time t. Moreover, the graph 542 plots power, e.g. peak-to-peak power, etc., of the source RF pulsed signal 550 versus the time t. Moreover, the graph 556 plots power, e.g. peak-to-peak power, etc., of a source RF pulsed signal 560 versus the time t. As an example, the source RF pulsed signal 560 is an example of a modified source RF pulsed signal output from the match circuit 215 (FIG. 5A).

The source RF pulsed signal 548 has the positive amount A2 of power during the state S1 and has zero power during the state S0. Moreover, the source RF pulsed signal 550 has the positive amount A3 of power during the state S1 and has zero power during the state S0. The source RF pulsed signal 548 is generated by the source RF generator 516 (FIG. 5A) and the source RF pulsed signal 550 is generated by the source RF generator 518 (FIG. 5A).

Also, the graph 544 plots power, e.g. peak-to-peak power, etc., of the bias RF pulsed signal 552 versus the time t. The graph 546 plots power, e.g. peak-to-peak power, etc., of the bias RF pulsed signal 554 versus the time t. The graph 558 plots power, e.g. peak-to-peak power, etc., of the bias RF pulsed signal 562 versus the time t. As an example, the bias RF pulsed signal 562 is an example of a modified bias RF pulsed signal output from the match circuit 216 (FIG. 5A). The bias RF pulsed signal 552 has the positive amount A1 of power during the state S1 and has zero power during the state S0. Moreover, the bias RF pulsed signal 554 has the positive amount A4 of power during the state S1 and has zero power during the state S0. The bias RF pulsed signal 552 is generated by the bias RF generator 520 (FIG. 5A) and the bias RF pulsed signal 554 is generated by the bias RF generator 522 (FIG. 5A).

The source RF pulsed signals 548 and 550 are combined, e.g., summed, etc., in the match circuit 215 (FIG. 5A) to generate the source RF pulsed signal 560 as an output of the match circuit 215. It should be noted that the source RF signal 560 has the positive amount A2 of power during the state S1 and has the positive amount of power A3 during the state S0. For example, when the source RF pulsed signal 548 has the positive amount A2 of power during the state S1, the source RF pulsed signal 550 has the zero amount of power during the state S0, and the positive amount A2 is combined with the zero amount to generate the state S1 of the source RF pulsed signal 560. As another example, when the source RF pulsed signal 548 has the zero amount of power during the state S0, the source RF pulsed signal 550 has the positive amount A3 of power during the state S1, and the positive amount A3 is combined with the zero amount to generate the state S0 of the source RF pulsed signal 560. It should be noted that the positive amount A3 is lower than the amount A2.

Similarly, the bias RF pulsed signals 552 and 554 are combined, e.g., summed, etc., in the match circuit 216 (FIG. 5A) to generate the bias RF pulsed signal 562 as an output of the match circuit 216. It should be noted that the bias RF signal 562 has the positive amount A1 of power during the state S1 and has the positive amount of power A4 during the state S0. For example, when the bias RF pulsed signal 552 has the zero amount of power during the state S0, the bias RF pulsed signal 554 has the positive amount A4 of power during the state S1, and the positive amount A4 is combined with the zero amount to generate the state S0 of the bias RF pulsed signal 562. As another example, when the bias RF pulsed signal 552 has the positive amount A1 of power during the state S1, the bias RF pulsed signal 554 has the zero amount of power during the state S0, and the positive amount A1 is combined with the zero amount to generate the state S1 of the bias RF pulsed signal 562. It should be noted that the positive amount A4 is lower than the amount A1.

In one embodiment, functions described herein as being performed by one processor are performed by multiple processors, e.g., are distributed between multiple processors. It should be noted that in one embodiment, the simultaneous generation and provision of the TCP RF pulsed signal 402 (FIG. 4A) having the state S0 and the bias RF pulsed signal 404 (FIG. 4A) having the state S1 reduces the temperature Te of the electrons and the reduction in the temperature Te increases an influence of power of the bias RF pulsed signal 404. The increase in the influence increases vertical directionality of the ions 106 towards the ESC 202 (FIG. 2) to perform an etch operation of high aspect ratio features, e.g., ratio of 50:1, ratio of 100:1, etc. of the substrate stack 100 (FIG. 1). In an embodiment, a vertical directionality of the ions 106 increases when the ions 106 are directed more in the vertical direction 110 (FIG. 1) compared to the lateral direction 236 (FIG. 2). For example, if the ions 106 travel in a direction greater than 45 degrees with respect to the lateral direction 236 towards the ESC 202 (FIG. 2), the ions 106 are directed more in the vertical direction 110 compared to the lateral direction 236.

Embodiments, described herein, may be practiced with various computer system configurations including hand-held hardware units, microprocessor systems, microprocessor-based or programmable consumer electronics, minicomputers, mainframe computers and the like. The embodiments, described herein, can also be practiced in distributed computing environments where tasks are performed by remote processing hardware units that are linked through a computer network.

In some embodiments, a controller, e.g., the host system, etc. is part of a system, which may be part of the above-described examples. The system includes semiconductor processing equipment, including a processing tool or tools, chamber or chambers, a platform or platforms for processing, and/or specific processing components (a wafer pedestal, a gas flow system, etc.). The system is integrated with electronics for controlling its operation before, during, and after processing of a semiconductor wafer or substrate. The electronics is referred to as the "controller," which may control various components or subparts of the system. The controller, depending on processing requirements and/or a type of the system, is programmed to control any process disclosed herein, including a delivery of process gases, temperature settings (e.g., heating and/or cooling), pressure settings, vacuum settings, power settings, RF generator settings, RF matching circuit settings, frequency settings, flow rate settings, fluid delivery settings, positional and operation settings, wafer transfers into and out of a tool and other transfer tools and/or load locks connected to or interfaced with the system.

Broadly speaking, in a variety of embodiments, the controller is defined as electronics having various integrated circuits, logic, memory, and/or software that receive instructions, issue instructions, control operation, enable cleaning operations, enable endpoint measurements, and the like. The integrated circuits include chips in the form of firmware that store program instructions, digital signal processors (DSPs), chips defined as Application Specific Integrated Circuits (ASICs), programmable logic devices (PLDs), one or more microprocessors, or microcontrollers that execute program instructions (e.g., software). The program instructions are instructions communicated to the controller in the form of various individual settings (or program files), defining operational parameters for carrying out a process on or for a semiconductor wafer. The operational parameters are, in some embodiments, a part of a recipe defined by process engineers to accomplish one or more processing steps during the fabrication of one or more layers, materials, metals, oxides, silicon, silicon dioxide, surfaces, circuits, and/or dies of a wafer.

The controller, in some embodiments, is a part of or coupled to a computer that is integrated with, coupled to the system, otherwise networked to the system, or a combination thereof. For example, the controller is in a "cloud" or all or a part of a fab host computer system, which allows for remote access for wafer processing. The controller enables remote access to the system to monitor current progress of fabrication operations, examines a history of past fabrication operations, examines trends or performance metrics from a plurality of fabrication operations, to change parameters of current processing, to set processing steps to follow a current processing, or to start a new process.

In some embodiments, a remote computer (e.g. a server) provides process recipes to the system over a computer network, which includes a local network or the Internet. The remote computer includes a user interface that enables entry or programming of parameters and/or settings, which are then communicated to the system from the remote computer. In some examples, the controller receives instructions in the form of settings for processing a wafer. It should be understood that the settings are specific to a type of process to be performed on a wafer and a type of tool that the controller interfaces with or controls. Thus as described above, the controller is distributed, such as by including one or more discrete controllers that are networked together and working towards a common purpose, such as the fulfilling processes described herein. An example of a distributed controller for such purposes includes one or more integrated circuits on a chamber in communication with one or more integrated circuits located remotely (such as at a platform level or as part of a remote computer) that combine to control a process in a chamber.

Without limitation, in various embodiments, the system includes a plasma etch chamber, a deposition chamber, a spin-rinse chamber, a metal plating chamber, a clean chamber, a bevel edge etch chamber, a physical vapor deposition (PVD) chamber, a chemical vapor deposition (CVD) chamber, an atomic layer deposition (ALD) chamber, an atomic layer etch (ALE) chamber, an ion implantation chamber, a track chamber, and any other semiconductor processing chamber that is associated or used in fabrication and/or manufacturing of semiconductor wafers.

It is further noted that although the above-described operations are described with reference to a transformer coupled plasma (TCP) reactor, in some embodiments, the above-described operations apply to other types of plasma chambers, e.g., conductor tools, etc.

As noted above, depending on a process operation to be performed by the tool, the controller communicates with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

With the above embodiments in mind, it should be understood that some of the embodiments employ various computer-implemented operations involving data stored in computer systems. These computer-implemented operations are those that manipulate physical quantities.

Some of the embodiments also relate to a hardware unit or an apparatus for performing these operations. The apparatus is specially constructed for a special purpose computer. When defined as a special purpose computer, the computer performs other processing, program execution or routines that are not part of the special purpose, while still being capable of operating for the special purpose.

In some embodiments, the operations, described herein, are performed by a computer selectively activated, or are configured by one or more computer programs stored in a computer memory, or are obtained over a computer network. When data is obtained over the computer network, the data may be processed by other computers on the computer network, e.g., a cloud of computing resources.

One or more embodiments, described herein, can also be fabricated as computer-readable code on a non-transitory computer-readable medium. The non-transitory computer-readable medium is any data storage hardware unit, e.g., a memory device, etc., that stores data, which is thereafter read by a computer system. Examples of the non-transitory computer-readable medium include hard drives, network attached storage (NAS), ROM, RAM, compact disc-ROMs (CD-ROMs), CD-recordables (CD-Rs), CD-rewritables (CD-RWs), magnetic tapes and other optical and non-optical data storage hardware units. In some embodiments, the non-transitory computer-readable medium includes a computer-readable tangible medium distributed over a network-coupled computer system so that the computer-readable code is stored and executed in a distributed fashion.

Although some method operations, described above, were presented in a specific order, it should be understood that in various embodiments, other housekeeping operations are performed in between the method operations, or the method operations are adjusted so that they occur at slightly different times, or are distributed in a system which allows the occurrence of the method operations at various intervals, or are performed in a different order than that described above.

It should further be noted that in an embodiment, one or more features from any embodiment described above are combined with one or more features of any other embodiment without departing from a scope described in various embodiments described in the present disclosure.

Although the foregoing embodiments have been described in some detail for purposes of clarity of understanding, it will be apparent that certain changes and modifications can be practiced within the scope of appended claims. Accordingly, the present embodiments are to be considered as illustrative and not restrictive, and the embodiments are not to be limited to the details given herein, but may be modified within the scope and equivalents of the appended claims.

The invention claimed is:

1. A method comprising:
generating a first radio frequency (RF) pulsed signal to have a high state and a low state, wherein the high state of the first RF pulsed signal has a greater amount of power than the low state of the first RF pulsed signal;
providing the first RF pulsed signal to a top coil electrode associated with a plasma chamber;
generating a second RF pulsed signal to have a low state for a first time period during which the first RF pulsed signal is in the high state and to have a high state for a second time period during which the first RF pulsed signal is in the low state, wherein the high state of the second RF pulsed signal has a greater amount of power than the low state of the second RF pulsed signal, wherein generating the second RF pulsed signal includes:
transitioning the second RF pulsed signal from the low state to the high state at a time of transition of the first RF pulsed signal from the high state to the low state; and
transitioning the second RF pulsed signal from the high state to the low state at a time of transition of the first RF pulsed signal from the low state to the high state, wherein said transitioning the second RF pulsed signal from the low state to the high state at the time of transition of the first RF pulsed signal from the high state to the low state is performed during a conductor etch to control directionality of ions within plasma and to reduce a temperature of electrons within the plasma;
providing the second RF pulsed signal to a bottom electrode of the plasma chamber.

2. The method of claim 1, wherein the top coil electrode is one or more RF coils, and the bottom electrode is a chuck of the plasma chamber.

3. The method of claim 1, wherein the high state of the second RF pulsed signal and the low state of the first RF pulsed signal act to decrease the temperature of the electrons in the plasma chamber, such that the decrease in the temperature assists in enhancing a directionality of the ions in the plasma chamber.

4. The method of claim 1,
wherein generating the first RF pulsed signal comprises:
transitioning the first RF pulsed signal from the high state to the low state within a predetermined amount of time from a transition of a digital signal from a first state to a second state; and
transitioning the first RF pulsed signal from the low state to the high state within a predetermined amount of time from a transition of the digital signal from the second state to the first state,
wherein generating the second RF pulsed signal comprises:
transitioning the second RF pulsed signal from the low state to the high state within a predetermined amount of time from the transition of the digital signal from the first state to the second state; and
transitioning the second RF pulsed signal from the high state to the low state within a predetermined amount of time from the transition of the digital signal from the second state to the first state.

5. The method of claim 1, wherein generating the first RF pulsed signal comprises:
transitioning the first RF pulsed signal from the high state to the low state at a time of a transition of a digital signal from a first state to a second state; and
transitioning the first RF pulsed signal from the low state to the high state at a time of a transition of the digital signal from the second state to the first state.

6. The method of claim 5, wherein generating the second RF pulsed signal comprises:
transitioning the second RF pulsed signal from the low state to the high state at the time of the transition of the digital signal from the first state to the second state; and
transitioning the second RF pulsed signal from the high state to the low state at the time of the transition of the digital signal from the second state to the first state.

7. The method of claim 1, wherein the first RF pulsed signal has zero power during the low state of the first RF pulsed signal and a positive amount of power during the high state of the first RF pulsed signal.

8. The method of claim 7, wherein the second RF pulsed signal has zero power during the low state of the second RF pulsed signal and a positive amount of power during the high state of the second RF pulsed signal.

9. The method of claim 1, wherein the first RF pulsed signal has a positive amount of power during the high state of the first RF pulsed signal and a positive amount of power during the low state of the first RF pulsed signal.

10. The method of claim 9, wherein the second RF pulsed signal has a positive amount of power during the high state of the second RF pulsed signal and a positive amount of power during the low state of the second RF pulsed signal.

11. The method of claim 1, further comprising:
synchronizing a transition of the first RF pulsed signal with a digital signal; and
synchronizing a transition of the second RF pulsed signal with the digital signal,
wherein the digital signal is generated by a clock source, wherein the clock source is located within an RF generator.

12. The method of claim 1, further comprising:
synchronizing a transition of first RF pulsed signal with a digital signal; and
synchronizing a transition of the second RF pulsed signal with the digital signal,
wherein the digital signal is generated by a clock source, wherein the clock source is located within a host system coupled to an RF generator.

13. The method of claim 1, further comprising:
synchronizing a transition of first RF pulsed signal with a digital signal; and
synchronizing a transition of the second RF pulsed signal with the digital signal.

14. A method comprising:
receiving a digital signal periodically transitioning between a first state and a second state; and
providing a first radio frequency (RF) pulsed signal to a top coil electrode associated with a plasma chamber and a second RF pulsed signal to a bottom electrode of the plasma chamber, wherein said providing the first RF pulsed signal includes synchronizing based on the digital signal a high state of the first RF pulsed signal with a low state of the second RF pulsed signal and a low state of the first RF pulsed signal with a high state of the second RF pulsed signal, wherein synchronizing based on the digital signal includes transitioning the second RF pulsed signal from the low state to the high state at a time of transition of the first RF pulsed signal from the high state to the low state and transitioning the second RF pulsed signal from the high state to the low state at a time of transition of the first RF pulsed signal from the low state to the high state, wherein said transitioning the second RF pulsed signal from the low state to the high state at the time of transition of the first RF pulsed signal from the high state to the low state is performed during a conductor etch to control directionality of ions within plasma and to reduce a temperature of electrons within the plasma, wherein the high state of the first RF pulsed signal has a greater amount of power than the low state of the first RF pulsed signal, wherein the high state of the second RF pulsed signal has a greater amount of power than the low state of the second RF pulsed signal.

15. The method of claim 14, wherein providing the first RF pulsed signal occurs is performed while providing the second RF pulsed signal such that the ions generated in the plasma chamber are influenced to have increased vertical directionality towards a chuck to process an etch operation of high aspect ratio features.

16. The method of claim 14, wherein said synchronizing based on the digital signal comprises:
    transitioning the first RF pulsed signal from the high state of the first RF pulsed signal to the low state of the first RF pulsed signal when the digital signal transitions from the first state to the second state;
    transitioning the first RF pulsed signal from the low state of the first RF pulsed signal to the high state of the first RF pulsed signal when the digital signal transitions from the second state to the first state;
    transitioning the second RF pulsed signal from the high state of the second RF pulsed signal to the low state of the second RF pulsed signal when the digital signal transitions from the second state to the first state; and
    transitioning the second RF pulsed signal from the low state of the second RF pulsed signal to the high state of the second RF pulsed signal when the digital signal transitions from the first state to the second state.

17. The method of claim 14, wherein the first RF pulsed signal is in the high state when the second RF pulsed signal is in the low state and the first RF pulsed signal is in the low state when the second RF pulsed signal is in the high state.

18. The method of claim 14, wherein the digital signal is a clock signal.

* * * * *